(12) United States Patent
O'Brien et al.

(10) Patent No.: US 11,538,964 B2
(45) Date of Patent: Dec. 27, 2022

(54) OPTOELECTRONIC SEMICONDUCTOR CHIP AND METHOD OF MANUFACTURING AN OPTOELECTRONIC SEMICONDUCTOR CHIP

(71) Applicant: Osram OLED GmbH, Regensburg (DE)

(72) Inventors: David O'Brien, Portland, OR (US); Desiree Queren, Neutraubling (DE); David Racz, Regensburg (DE); Britta Goeoetz, Regensburg (DE); Michael Schumann, Neu-Ulm (DE)

(73) Assignee: OSRAM OLED GmbH, Regensburg (DE)

( * ) Notice: Subject to any disclaimer, the term of this patent is extended or adjusted under 35 U.S.C. 154(b) by 88 days.

(21) Appl. No.: 16/756,846

(22) PCT Filed: Oct. 16, 2018

(86) PCT No.: PCT/EP2018/078257
§ 371 (c)(1),
(2) Date: Apr. 17, 2020

(87) PCT Pub. No.: WO2019/076902
PCT Pub. Date: Apr. 25, 2019

(65) Prior Publication Data
US 2020/0243728 A1     Jul. 30, 2020

(30) Foreign Application Priority Data

Oct. 18, 2017   (DE) .................. 10 2017 124 307.0

(51) Int. Cl.
*H01L 33/50*    (2010.01)
*H01L 27/15*    (2006.01)
(Continued)

(52) U.S. Cl.
CPC .......... *H01L 33/504* (2013.01); *H01L 27/156* (2013.01); *H01L 33/382* (2013.01);
(Continued)

(58) Field of Classification Search
CPC ..... H01L 33/504; H01L 33/382; H01L 33/46; H01L 33/505; H01L 33/507
See application file for complete search history.

(56) References Cited

U.S. PATENT DOCUMENTS

| 2014/0354178 A1 | 12/2014 | Siessegger et al. |
| 2015/0014716 A1 | 1/2015 | Von Malm |

(Continued)

FOREIGN PATENT DOCUMENTS

| DE | 102011056888 A1 | 6/2013 |
| DE | 102012102301 A1 | 9/2013 |

(Continued)

OTHER PUBLICATIONS

International Search Report issued for corresponding PCT-Application No. PCT/EP2018/078257, dated Feb. 1, 2019, 3 pages (for informational purpose only).
German Search Report issued for corresponding DE-Application No. 10 2017 124 307.0, dated Sep. 18, 2019, 7 pages (for informational purpose only).

*Primary Examiner* — Mark W Tornow
(74) *Attorney, Agent, or Firm* — Viering, Jentschura & Partner mbB (57) ABSTRACT

An optoelectronic semiconductor chip may include an active region configured to emit electromagnetic radiation during operation of said optoelectronic semiconductor chip. The optoelectronic semiconductor chip comprises conversion elements arranged to convert the wavelength of the electromagnetic radiation emitted by the active region during operation, and at least one barrier at least partially impermeable to the electromagnetic radiation emitted by the (Continued)

active region. The barrier is disposed in a lateral direction between the conversion elements, the lateral direction being parallel to the main extension plane of the semiconductor body, and the barrier extending transversely to the lateral direction. The active region has at least two emission regions which can be driven separately from each other, and each of the conversion elements is disposed in a radiation direction of the electromagnetic radiation emitted from one of the emission regions. A method for manufacturing an optoelectronic semiconductor chip is also disclosed.

20 Claims, 5 Drawing Sheets

(51) Int. Cl.
  *H01L 33/38* (2010.01)
  *H01L 33/46* (2010.01)
(52) U.S. Cl.
  CPC ............ *H01L 33/46* (2013.01); *H01L 33/505* (2013.01); *H01L 33/507* (2013.01); *H01L 2933/0025* (2013.01); *H01L 2933/0041* (2013.01); *H01L 2933/0091* (2013.01)

(56) References Cited

U.S. PATENT DOCUMENTS

| | | | |
|---|---|---|---|
| 2015/0049502 A1 | 2/2015 | Brandl et al. | |
| 2015/0325598 A1* | 11/2015 | Pfeuffer | H01L 25/167 257/59 |
| 2016/0027765 A1* | 1/2016 | von Malm | H01L 23/5386 257/72 |
| 2016/0146434 A1 | 5/2016 | Mönch et al. | |
| 2017/0062672 A1 | 3/2017 | Goeoetz et al. | |
| 2017/0250316 A1 | 8/2017 | Yeon et al. | |
| 2017/0309794 A1 | 10/2017 | Von Malm | |
| 2018/0259852 A1* | 9/2018 | Tanigaki | G03F 7/028 |
| 2019/0074413 A1 | 3/2019 | Streppel | |
| 2019/0104246 A1 | 4/2019 | Antretter et al. | |

FOREIGN PATENT DOCUMENTS

| | | |
|---|---|---|
| DE | 112013000619 T5 | 11/2014 |
| DE | 102013107227 A1 | 1/2015 |
| DE | 102014112551 A1 | 3/2016 |
| DE | 112015001180 T5 | 12/2016 |
| DE | 102016104385 A1 | 9/2017 |
| DE | 112017001201 A5 | 12/2018 |
| EP | 2677232 A1 | 12/2013 |

* cited by examiner

OPTOELECTRONIC SEMICONDUCTOR CHIP AND METHOD OF MANUFACTURING AN OPTOELECTRONIC SEMICONDUCTOR CHIP

CROSS-REFERENCE TO RELATED APPLICATIONS

The present application is a national stage entry according to 35 U.S.C. § 371 of PCT application No.: PCT/EP2018/078257 filed on Oct. 16, 2018; which claims priority to German Patent Application Serial No.: 10 2017 124 307.0 filed on Oct. 18, 2017; all of which are incorporated herein by reference in their entirety and for all purposes.

TECHNICAL FIELD

An optoelectronic semiconductor chip and a method of manufacturing an optoelectronic semiconductor chip are given.

BACKGROUND

One object to be achieved is to specify an optoelectronic semiconductor chip with a particularly homogeneous radiation characteristic. A further object to be achieved is to specify a method for manufacturing an optoelectronic semiconductor chip with a homogeneous radiation characteristic.

SUMMARY

According to at least one embodiment of the optoelectronic semiconductor chip, the optoelectronic semiconductor chip comprises an active region in a semiconductor body having a main plane of extension, the active region being arranged to emit electromagnetic radiation during operation of the optoelectronic semiconductor chip.

The semiconductor chip is, for example, a luminescent diode chip such as a light emitting diode chip or a laser diode chip. The active region can thus be arranged to emit light, for example blue light, during operation. The active region can have a quantum well structure.

The semiconductor body can be a three-dimensional body, which for example has the shape of a cuboid or a cylinder. In this case, the main plane of extension of the semiconductor body is parallel to one of the top surfaces of the cylinder. The semiconductor body can be formed with a semiconductor material. The active region may extend in a plane parallel to the main plane of the semiconductor body.

According to at least one embodiment, the optoelectronic semiconductor chip comprises at least two conversion elements which are arranged to convert the wavelength of the electromagnetic radiation emitted from the active region during operation. This means that the wavelength of the electromagnetic radiation emitted from the active region during operation may be different from the wavelength of the converted electromagnetic radiation emitted at a radiation exit side of the conversion elements. The radiation exit side is disposed on the side of the conversion elements facing away from the active region. It is also possible that the conversion elements are disposed to convert a range of wavelengths of the electromagnetic radiation emitted from the active region during operation. This means, for example, that the active region emits light of a first color during operation and that light of a second color exits from the conversion elements. In other words, primary radiation from a first wavelength range can be emitted in the active region during operation. The conversion element converts at least part of the primary radiation into secondary radiation from a second wavelength range. In particular, it is possible that the second wavelength range includes wavelengths that are longer than the wavelengths in the first wavelength range. The conversion elements may be at least partially transparent to the electromagnetic radiation emitted from the active region during operation. Thus, it is also possible that mixed light from the electromagnetic radiation emitted from the active region during operation and the converted electromagnetic radiation from the conversion elements will escape. The electromagnetic radiation exiting from the conversion elements during operation can be colored light, such as red, green or blue light, or white mixed light with different color temperatures, depending on the design of the conversion elements.

The optoelectronic semiconductor chip may have a plurality of conversion elements disposed side by side in lateral directions, the lateral directions being parallel to the main plane of extension of the semiconductor body.

According to at least one embodiment, the optoelectronic semiconductor chip comprises at least one barrier which is at least partially impermeable to the electromagnetic radiation emitted from the active region. The barrier can be, for example, a partition wall or a boundary. In a non-limiting embodiment, the barrier is impermeable or nearly impermeable to the electromagnetic radiation emitted from the active region. In addition, the barrier may be reflective to the electromagnetic radiation emitted from the active region. For example, the barrier may have a light reflecting or scattering material such as $TiO_2$. The barrier may appear white, for example.

According to at least one embodiment, the barrier is disposed in a lateral direction between the conversion elements, the lateral direction being parallel to the main plane of extension of the semiconductor body. This means that the barrier can be disposed between all conversion elements that are adjacent to each other. The conversion elements can be disposed directly adjacent to the barrier or at a distance from the barrier.

According to at least one embodiment, the barrier extends transversely to the lateral direction. This means that the barrier has an extension in one direction, which is transverse to the lateral direction. For example, the barrier may extend in a vertical direction perpendicular to the main plane of the semiconductor body. The barrier can extend at least as far in the vertical direction as the conversion elements. The barrier can, for example, project above the conversion elements in the vertical direction or be flush with them. In addition, the barrier may extend in lateral directions. This may mean that the barrier extends along a lateral extension of a conversion element.

According to at least one embodiment, the active region has at least two emission regions, which can be controlled separately from each other. The at least two emission regions may be disposed side-by-side in the lateral direction. Each of the emission regions is disposed to emit electromagnetic radiation during operation. The emission regions can be arranged to emit electromagnetic radiation of the same wavelength during operation. The fact that the at least two emission regions can be controlled separately may mean that a first of the emission regions can be controlled independently of a second of the emission regions. Thus, for example, the first of the emission regions can be controlled so that it emits electromagnetic radiation during a period of time while the second of the emission regions is controlled so that it does not emit electromagnetic radiation during the same period of time, or vice versa.

According to at least one embodiment, each of the conversion elements is disposed in a direction of emission of electromagnetic radiation emitted from one of the emission regions. This means that a conversion element is assigned to each of the emission regions. For example, each of the conversion elements can be disposed vertically above one of the emission regions. Thus, the electromagnetic radiation emitted by each of the emission regions during operation hits one of the conversion elements. In a non-limiting embodiment, each of the conversion elements completely covers one of the emission regions in lateral directions. This means that all electromagnetic radiation emitted from one of the emission regions can hit one of the conversion elements. However, the conversion elements do not necessarily cover the entire active region. This means that there may also be emission regions that are not followed by a conversion element. From these, unconverted primary radiation, for example blue light, can then be emitted.

The electromagnetic radiation emitted by the emission regions during operation can thus exit from the semiconductor chip at the radiation exit side of the conversion elements. Thus, the conversion elements can be used to adjust or change the color of the electromagnetic radiation emitted by the optoelectronic semiconductor chip.

According to at least one embodiment of the optoelectronic semiconductor chip, the optoelectronic semiconductor chip comprises an active region in a semiconductor body having a main plane of extension, the active region being arranged to emit electromagnetic radiation during operation of the optoelectronic semiconductor chip. The optoelectronic semiconductor chip comprises at least two conversion elements arranged to convert the wavelength of the electromagnetic radiation emitted by the active region during operation and at least one barrier which is at least partially impermeable to the electromagnetic radiation emitted by the active region. The barrier is disposed in a lateral direction between the conversion elements, the lateral direction being parallel to the main plane of extension of the semiconductor body, and the barrier extends transversely to the lateral direction. In addition, the active region has at least two emission regions which are separately controllable and each of the conversion elements is disposed in a direction of emission of electromagnetic radiation emitted from one of the emission regions.

The optoelectronic semiconductor chip described herein is based, inter alia, on the idea that a plurality of emission regions, each with its own conversion element, can be disposed in just one optoelectronic semiconductor chip. The barrier prevents or reduces crosstalk between the various conversion elements. By placing the barrier between two conversion elements, electromagnetic radiation from one of the conversion elements cannot or can only slightly enter or reach one of the other conversion elements. Especially when using different conversion elements, it is advantageous to avoid crosstalk between the conversion elements. If electromagnetic radiation from one of the conversion elements enters another conversion element it can lead to spatial color inhomogeneities of the light emitted by the optoelectronic semiconductor chip. Thus, the barrier enables a homogeneous radiation characteristic of the optoelectronic semiconductor chip.

Furthermore, the barrier prevents scattering and reabsorption processes in the conversion elements. By means of scattering processes, for example, the light emitted by the semiconductor chip can be spatially inhomogeneously expanded. Furthermore, the wavelength or color of the electromagnetic radiation emitted by the optoelectronic semiconductor chip can be adjusted or changed by separately controlling the individual emission regions. For example, different groups of emission regions can be controlled so that the electromagnetic radiation emitted by the semiconductor chip has a different wavelength or color in each case.

According to at least one embodiment, the extension of each of the conversion elements in the vertical direction perpendicular to the principal plane of extension of the semiconductor body is at most 30% of the maximum lateral extension of the respective conversion element. In a non-limiting embodiment, the expansion of each of the conversion elements in the vertical direction shall not exceed 25% of the maximum lateral expansion of the respective conversion element. It is also possible that the expansion of each of the conversion elements in the vertical direction is at most 20% of the maximum lateral expansion of the respective conversion element. The maximum lateral expansion of each of the conversion elements corresponds to the maximum expansion in a lateral direction. The lateral extent of one of the conversion elements may be equal to the lateral extent of the associated emission region. For example, the lateral expansion of each of the conversion elements can be at least 5 µm and at most 250 µm. Thus, the conversion elements can be particularly thin in the vertical direction. This is advantageous in order to keep the expansion of the optoelectronic semiconductor chip in the vertical direction small. In addition, for particularly thin conversion elements, unnecessary radiation in lateral directions is reduced.

According to at least one embodiment, the extension of each of the conversion elements in the vertical direction perpendicular to the main plane of extension of the semiconductor body is at most 2 µm. Advantageously, the optoelectronic semiconductor chip can thus be particularly thin and radiation in lateral directions is reduced.

According to at least one embodiment, the expansion of each of the conversion elements in the vertical direction is at least 2 µm. If the conversion elements have a lateral expansion greater than 5 µm, an expansion of the conversion elements of at least 2 µm in the vertical direction may be required.

According to at least one embodiment, the barrier is formed by the semiconductor body. For this purpose, cavities or recesses can be formed in the semiconductor body, for example by etching into the semiconductor body. The cavities can be formed in the semiconductor body. This means that the barrier is formed by the semiconductor body, with cavities formed in the semiconductor body. The boundaries of the cavities form the barrier in this case. A reflective or absorptive material can be applied to side surfaces of the boundaries which are transverse or perpendicular to the main plane of the semiconductor body. This prevents electromagnetic radiation from one of the conversion elements from entering another conversion element. The conversion elements can be incorporated into the cavities. This allows the vertical distance between the conversion elements and the active region to be minimized. This allows the thickness of the optoelectronic semiconductor chip to be reduced in the vertical direction.

According to at least one embodiment, each of the conversion elements has a matrix material into which conversion particles are incorporated. The matrix material may be transparent or at least partially transparent to the electromagnetic radiation emitted from the active region during operation. The conversion particles are arranged to convert the wavelength of the electromagnetic radiation emitted from the active region. Thus, the wavelength or color of the electromagnetic radiation emitted by the semiconductor chip during operation can be adjusted or changed.

According to at least one embodiment, a lateral expansion of the conversion particles is at most 10% of the lateral expansion of one of the conversion elements. The lateral expansion of the conversion particles can be given by the diameter of the conversion particles or the expansion of the conversion particles in a lateral direction, for example. This size of conversion particles can efficiently convert the electromagnetic radiation emitted from the emission regions.

According to at least one embodiment, the conversion particles are quantum dots. The quantum dots can be formed with CdSe or InP, for example. Quantum dots can have particularly small lateral dimensions. For example, the quantum dots can each have a lateral extent of at least 2 nm and at most 500 nm. The smaller the lateral expansions of the conversion particles, the more conversion particles can be disposed per volume in the matrix material. Thus the volume of the conversion elements can be reduced for very small conversion particles.

Since a conversion element can be assigned to each emission region, it is advantageous if the conversion elements have a lateral extension which is similar or equal to the lateral extension of the respective emission region. Since the lateral expansion of the conversion particles is at most 10% of the lateral expansion of the conversion elements, the use of quantum dots as conversion particles enables a small lateral expansion of each of the conversion elements.

According to at least one embodiment, at least one first conversion element of the at least two conversion elements is arranged to convert the wavelength of the electromagnetic radiation emitted from the active region during operation into another wavelength than at least one second conversion element of the at least two conversion elements. For this purpose, the first and the second conversion element may have different materials. In addition, the first and second conversion elements may have different scattering particles.

It is further possible that at least one first conversion element of the two conversion elements is arranged to convert a wavelength range of the electromagnetic radiation emitted from the active region during operation into another wavelength range than at least one second conversion element of the at least two conversion elements. Thus, the electromagnetic radiation emitted from the first conversion element during operation may have a different color than the electromagnetic radiation emitted from the second conversion element during operation. The electromagnetic radiation emitted from the conversion elements during operation can also differ in parameters other than color, such as color temperature or spectrum.

Thus, the optoelectronic semiconductor chip can be arranged to emit electromagnetic radiation of different color, color temperature or with a different spectrum during operation.

According to at least one embodiment, the conversion elements are disposed at nodes of a two-dimensional lattice. The two-dimensional lattice can extend in a plane parallel to the main plane of the semiconductor body. For example, the two-dimensional lattice can be a regular lattice. The unit cell of the lattice can, for example, have the shape of a square or a rectangle. Thus, the conversion elements can be disposed evenly in one plane. This means that the emission regions can also be disposed at the nodes of the same two-dimensional lattice. Thus the optoelectronic semiconductor chip can have a plurality of conversion elements and a plurality of emission regions. This enables the optoelectronic semiconductor chip to emit electromagnetic radiation with different parameters during operation.

According to at least one embodiment, the barrier completely surrounds each of the conversion elements in lateral directions, the lateral directions being parallel to the main plane of extension of the semiconductor body. This means, for example, that the barrier has the shape of a lattice that completely surrounds each of the conversion elements in lateral directions. Thus, the barrier prevents crosstalk between different conversion elements in each of the lateral directions.

According to at least one embodiment, the emission regions are monolithically formed with each other. This means that the active region of the semiconductor chip includes the emission regions. Thus the semiconductor chip can have a plurality of emission regions in a semiconductor body.

According to at least one embodiment, the barrier has a metal. The metal may be at least partially impermeable to the electromagnetic radiation emitted from the active region during operation. The metal can also be reflective for electromagnetic radiation. This prevents electromagnetic radiation from one of the conversion elements from entering another conversion element.

A method of manufacturing an optoelectronic semiconductor chip is also given. The optoelectronic semiconductor chip can be manufactured using a method described herein. In other words, all features disclosed for the optoelectronic semiconductor chip are also disclosed for the method of manufacturing an optoelectronic semiconductor chip and vice versa.

According to at least one embodiment of the method of manufacturing an optoelectronic semiconductor chip, the method comprises a method step in which a semiconductor body with a main plane of extension is provided. The semiconductor body can be formed with gallium nitride, for example.

According to at least one embodiment, the method further comprises the step of providing an active region arranged to emit electromagnetic radiation during operation of the optoelectronic semiconductor chip. The active region can be disposed in the semiconductor body.

According to at least one embodiment, the method further comprises the step of applying at least two conversion elements to the semiconductor body, the conversion elements being arranged to convert the wavelength of the electromagnetic radiation emitted from the active region during operation. In a non-limiting embodiment, the conversion elements are applied to one side of the semiconductor body where the electromagnetic radiation emitted from the active region during operation exits the semiconductor body. The conversion elements are disposed side by side in lateral directions, the lateral directions being parallel to the main plane of the semiconductor body.

According to at least one embodiment, the method further comprises the step of forming a barrier which is at least partially impermeable to the electromagnetic radiation emitted from the active region. In a non-limiting embodiment, the barrier is completely impermeable or reflective to the electromagnetic radiation emitted from the active region.

According to at least one embodiment of the method, the barrier is disposed in a lateral direction between the conversion elements, the lateral direction being parallel to the main plane of extension of the semiconductor body. Thus, the barrier is disposed at the side of the semiconductor body where the electromagnetic radiation emitted from the active region during operation exits the semiconductor body. The barrier can have the shape of a two-dimensional lattice. In addition, the barrier may be in direct contact with at least part of the conversion elements or the barrier may be spaced apart from the conversion elements.

According to at least one embodiment of the method, the barrier extends transversely to the lateral direction. In a non-limiting embodiment, the barrier extends in a vertical direction, the vertical direction being perpendicular to the main plane of extension of the semiconductor body. In addition, the barrier may extend in lateral directions between the conversion elements.

According to at least one embodiment of the method, the active region has at least two emission regions which can be controlled separately. The at least two emission regions are disposed next to each other in lateral directions.

According to at least one embodiment of the method, each of the conversion elements is disposed in a direction of emission of electromagnetic radiation emitted from one of the emission regions. This means that the conversion elements are applied to the semiconductor body in such a way that one conversion element is disposed in each case in a direction of emission of the electromagnetic radiation emitted by one of the emission regions. For this purpose each of the conversion elements can be disposed vertically above one of the emission regions.

By placing the barrier between the conversion elements, crosstalk between the conversion elements is prevented or reduced. This means that the barrier prevents or reduces the entry of electromagnetic radiation from one conversion element to another conversion element. Especially if the optoelectronic semiconductor chip has different conversion elements, an inhomogeneous radiation characteristic of the semiconductor chip is thus avoided. The fact that the conversion elements are optically separated from each other enables a homogeneous radiation characteristic of the semiconductor chip.

In addition, the application of at least two conversion elements, such as a plurality of conversion elements, enables different properties of the electromagnetic radiation emitted by the optoelectronic semiconductor chip during operation to be adjusted. For example, the semiconductor chip may be arranged to emit electromagnetic radiation with different color temperatures and with different spectra or colors. Here, the emission regions, such as a plurality of emission regions, are disposed in a common semiconductor body of the semiconductor chip. The separate control of the emission regions allows the properties of the electromagnetic radiation emitted by the optoelectronic semiconductor chip during operation to be changed or adjusted.

According to at least one embodiment of the method, the barrier is formed before the application of the conversion elements. For this purpose, the barrier can be applied directly to the semiconductor body. For example, the barrier can be printed on the semiconductor body or formed by photolithography. In addition, the barrier can be applied to the semiconductor body by electrophoretic deposition. For this purpose, an electrically conductive material is applied to the semiconductor body prior to the application of the barrier, whereby the electrically conductive material is only applied at the places where the barrier is formed. By applying the barrier, for example, a two-dimensional lattice can be formed on the semiconductor body. The barrier extends transversely or perpendicular to the main plane of the semiconductor body. The lattice has cavities or recesses into which the conversion elements are incorporated.

According to at least one embodiment of the method, the barrier is formed by ablating the semiconductor body. For this purpose, cavities or recesses can be formed in the semiconductor body or etched into the semiconductor body. The boundaries of the cavities form the barrier in this case. A reflective or absorptive material can be applied to side surfaces of the boundaries which are transverse or perpendicular to the main plane of the semiconductor body. This prevents electromagnetic radiation from one of the conversion elements from entering another conversion element. The conversion elements can be incorporated into the cavities. This allows the vertical distance between the conversion elements and the active region to be minimized. This allows the thickness of the optoelectronic semiconductor chip to be reduced in the vertical direction.

According to at least one embodiment of the method, the barrier forms at least two cavities, into each of which a conversion element is incorporated. For this purpose, a matrix material and conversion particles are incorporated into the cavities. Thus a conversion element is formed in each of the cavities. The previous molding of the cavities allows a precise insertion of the matrix material with the conversion particles.

According to at least one embodiment of the method, the conversion elements are applied before the barrier is formed. For this purpose, one conversion element can be applied vertically over each emission region. The conversion elements can be applied by printing or photolithography, for example. It is also possible to chemically modify the surface of the semiconductor body in places in such a way that the material of the conversion elements only adheres to or is applied to the intended places. The barrier is then applied to the semiconductor body, for example in the form of a two-dimensional lattice between the conversion elements. Therefore a preformed barrier can be used.

BRIEF DESCRIPTION OF THE DRAWINGS

In the following, the optoelectronic semiconductor chip described herein and the method for manufacturing an optoelectronic semiconductor chip described herein are explained in more detail in conjunction with non-limiting embodiments and the associated figures.

Identical, similar or similar-looking elements are provided with the same reference signs in the figures. The figures and the proportions of the elements depicted in the figures relative to each other are not to be considered as true to scale. Rather, individual elements may be displayed in an exaggeratedly large format for better presentation and/or comprehensibility.

DETAILED DESCRIPTION

Figure 1A:
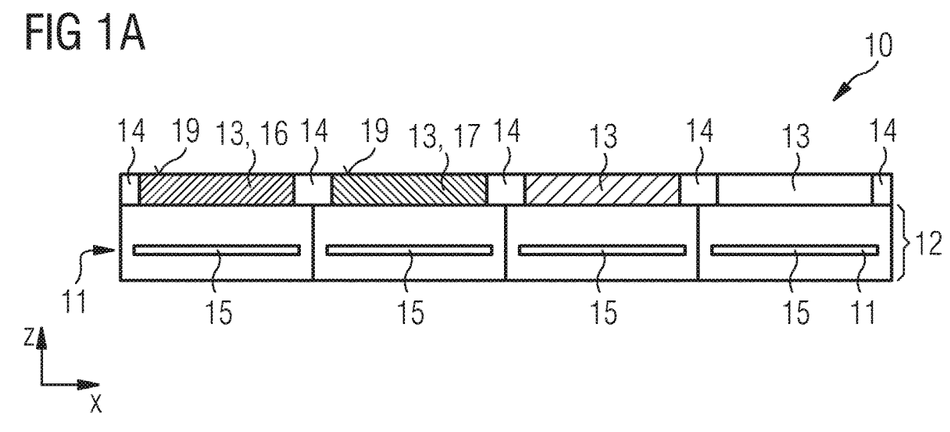
FIG. 1A shows a schematic cross-section of an optoelectronic semiconductor chip according to an exemplary embodiment.

FIG. 1A shows a schematic cross-section of an optoelectronic semiconductor chip 10 according to an exemplary embodiment. The optoelectronic semiconductor chip 10 comprises a semiconductor body 12, in which an active region 11 is disposed. The semiconductor body 12 has a main plane of extension. The active region 11 extends in a plane which is parallel to the main plane of the semiconductor body 12. In addition, the active region 11 is arranged to emit electromagnetic radiation during operation of the optoelectronic semiconductor chip 10.

The active region 11 has at least two, in this case four, emission regions 15, which can be controlled separately. The vertical lines between the emission regions 15 make it clear that these can be controlled separately. In addition, the emission regions 15 are monolithically formed with each other and each of the emission regions 15 is arranged to emit electromagnetic radiation during operation of the semiconductor chip 10. The emission regions 15 are disposed side by side in lateral directions x, which are parallel to the main plane of the semiconductor body 12.

Furthermore, the optoelectronic semiconductor chip 10 has at least two, in this case four, conversion elements 13. The conversion elements 13 are disposed side by side in lateral direction x. Each of the conversion elements 13 is arranged to convert the wavelength of the electromagnetic radiation emitted from the active region 11 during operation. In addition, each of the conversion elements 13 is disposed in a direction of emission of electromagnetic radiation emitted from one of the emission regions 15. This means that each of the conversion elements 13 is disposed in vertical direction z, which is perpendicular to the main plane of extension of the semiconductor body 12, above one of the emission regions 15. In addition, the conversion elements 13 have a radiation exit side 19, which faces away from the active region 11. At the radiation exit side 19 the converted electromagnetic radiation can exit the semiconductor chip 10. Conversion elements 13 can have a matrix material in which conversion particles are incorporated. The matrix material may be transparent or at least partially permeable to the electromagnetic radiation emitted from the active region 11 during operation. The conversion particles are arranged to convert the wavelength of the electromagnetic radiation emitted from the active region 11.

The conversion particles can be quantum dots, for example. The smaller the lateral expansions of the conversion particles, the more conversion particles can be disposed per volume in the matrix material. Thus the volume of the conversion elements 13 can be reduced for very small conversion particles. Advantageously, the volume and the expansion in vertical direction z of the conversion elements 13 are relatively small. Therefore, the optoelectronic semiconductor chip 10 can have a plurality of conversion elements 13. It is also possible that the optoelectronic semiconductor chip 10 has a separate conversion element 13 for each of the emission regions 15.

For this purpose, for example, the expansion of each of the conversion elements 13 in the vertical direction z can be at most 30% of the lateral expansion of the respective conversion element 13. For example, the expansion of each of the conversion elements 13 in the vertical direction z can be at most 2 μm. Furthermore, a lateral expansion of the conversion particles can be no more than 10% of the lateral expansion of one of the conversion elements 13.

The conversion elements 13 may be different, so that, for example, a first conversion element 16 is arranged to convert the wavelength of the electromagnetic radiation emitted from the active region 11 in operation to a different wavelength than at least a second conversion element 17. In this way the electromagnetic radiation emitted from the first conversion element 16 in operation may have a different color than the electromagnetic radiation emitted from the second conversion element 17 in operation. The electromagnetic radiation emitted from the conversion elements 13 during operation can also differ in parameters other than color, for example in color temperature or spectrum.

Furthermore, the optoelectronic semiconductor chip 10 has a barrier 14. Barrier 14 is at least partially impermeable to the electromagnetic radiation emitted from active region 11. For example, barrier 14 may contain a metal. The barrier 14 is disposed in lateral direction x between the conversion elements 13. Furthermore, barrier 14 extends perpendicular to the lateral direction x. The barrier 14 extends in vertical direction z as far as the conversion elements 13.

The barrier 14 prevents or reduces crosstalk between the different conversion elements 13. By placing the barrier 14 between two conversion elements 13, electromagnetic radiation from one of the conversion elements 13 cannot, or can only slightly, enter or reach one of the other conversion elements 13. Especially when using different conversion elements 13 it is advantageous to avoid crosstalk between the conversion elements 13. If electromagnetic radiation from one of the conversion elements 13 enters another conversion element 13 it can lead to spatial color inhomogeneities of the light emitted by the optoelectronic semiconductor chip 10. Barrier 14 thus enables a homogeneous radiation characteristic of the optoelectronic semiconductor chip 10.

Figure 1B:
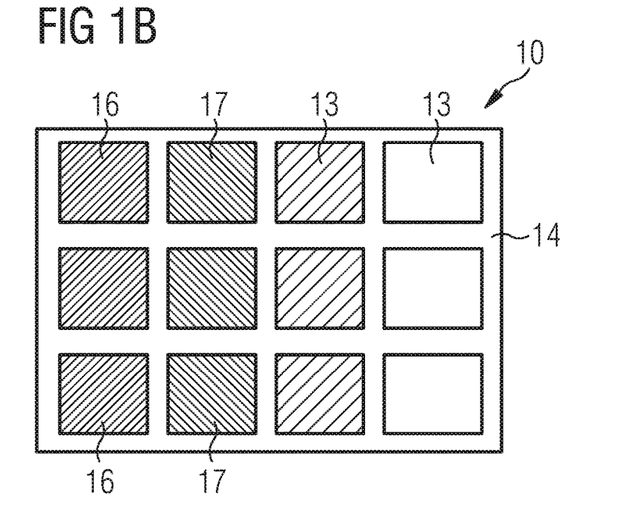
FIG. 1B shows a top view of an optoelectronic semiconductor chip according to an exemplary embodiment.

FIG. 1B shows a top view of an optoelectronic semiconductor chip 10 according to an exemplary embodiment. The top view shows twelve conversion elements 13 and the barrier 14. The barrier 14 completely surrounds each of the conversion elements 13 in lateral directions x. In addition, the conversion elements 13 are disposed at nodes of a regular two-dimensional lattice. Thus, barrier 14 also has the shape of a two-dimensional lattice. The conversion elements 13 are disposed in cavities 18 or recesses of the lattice. First conversion elements 16 may be arranged to convert the electromagnetic radiation emitted from the active region 11 to another wavelength than second conversion elements 17.

Figure 2A:
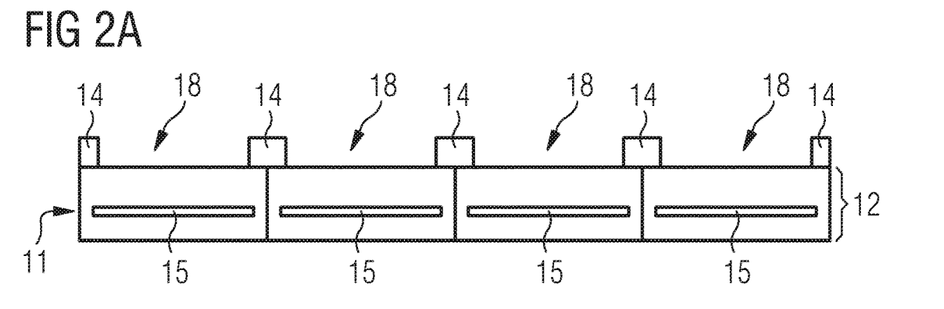
FIGS. 2A, 2B, 2C and 2D describe an exemplary embodiment of the method for manufacturing an optoelectronic semiconductor chip.

FIG. 2A shows a first method step of the method for manufacturing an optoelectronic semiconductor chip 10. A sectional view through a semiconductor body 12 is shown. To manufacture the optoelectronic semiconductor chip 10, a semiconductor body 12 with a main plane of extension is provided. An active region 11 is disposed in the semiconductor body 12, which is arranged to emit electromagnetic radiation during operation of the optoelectronic semiconductor chip 10. The active region 11 has at least two emission regions 15, which can be controlled separately. A barrier 14 is applied to the semiconductor body 12, which extends in a vertical direction z. Barrier 14 is at least partially impermeable to the electromagnetic radiation emitted from active region 11.

For example, barrier 14 can be printed on the semiconductor body 12 or formed by photolithography. In addition, barrier 14 can be applied to the semiconductor body 12 by electrophoretic deposition. For this purpose, an electrically conductive material is applied to the semiconductor body 12 prior to the application of barrier 14, whereby the electrically conductive material is only applied at the places where the barrier 14 is formed. By applying barrier 14, for example, a two-dimensional lattice with cavities 18 can be formed on semiconductor body 12. Thereby barrier 14 extends perpendicular to the main plane of the semiconductor body 12.

Figure 2B:
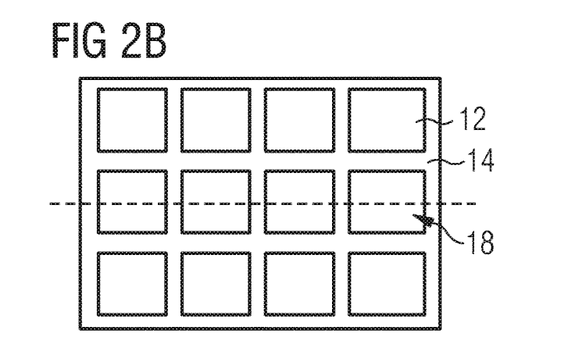

FIG. 2B shows a top view of semiconductor body 12 as shown in FIG. 2A. Barrier 14 is disposed as a two-dimensional lattice on semiconductor body 12. The barrier 14 also has cavities 18. The dotted line shows the section from FIG. 2A through semiconductor body 12.

Figure 2C:
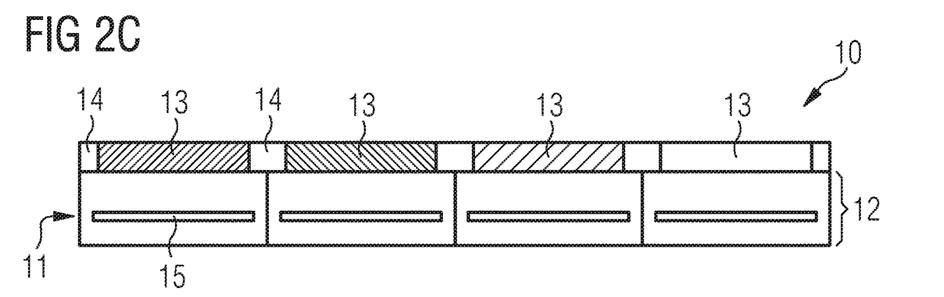

FIG. 2C shows the next step in the method with the aid of a sectional view through semiconductor body 12. The conversion elements 13 are incorporated into the cavities 18 and applied to the semiconductor body 12. Thus the barrier 14 is disposed in lateral directions x between the conversion elements 13. In addition, each of the conversion elements 13 is disposed in a direction of emission of electromagnetic radiation emitted from one of the emission regions 15. Since barrier 14 was formed before the application of the conversion elements 13, they can be precisely inserted into the cavities 18.

Figure 2D:
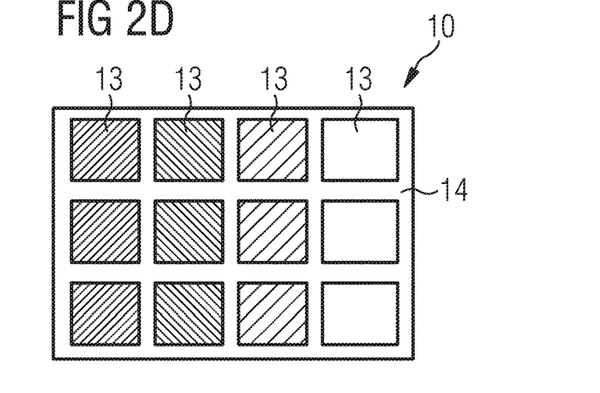

FIG. 2D shows a top view of semiconductor body 12 as shown in FIG. 2C. In the cavities 18 the conversion elements 13 are disposed at the nodes of a regular two-dimensional lattice. Thereby the conversion elements 13 can be different from each other.

Figure 3A:
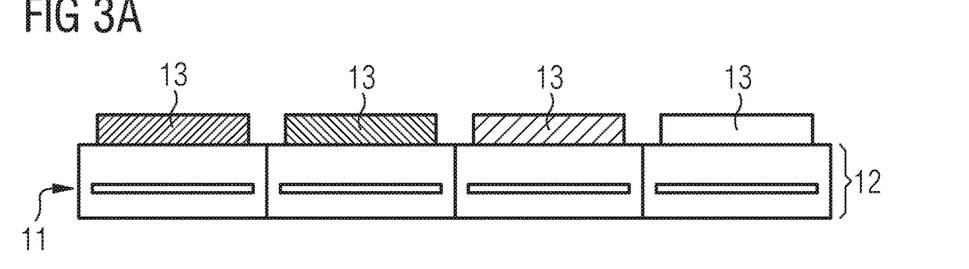
FIGS. 3A, 3B, 3C and 3D and FIGS. 4A, 4B, 4C and 4D are two further examples of the method.

FIG. 3A shows a sectional view through semiconductor body 12 to illustrate another example of the method. Conversion elements 13 are applied to the semiconductor body 12 before the barrier 14 is applied. The conversion elements 13 can be applied by printing or photolithography, for example. It is also possible to chemically modify the surface of the semiconductor body 12 in places in such a way that the material of the conversion elements 13 only adheres to or is applied to the intended places.

Figure 3B:
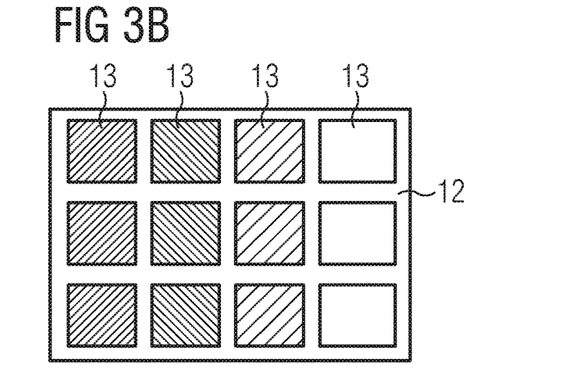

FIG. 3B shows a top view of semiconductor body 12 as shown in FIG. 3A. The conversion elements 13 are disposed at nodes of a two-dimensional lattice.

Figure 3C:
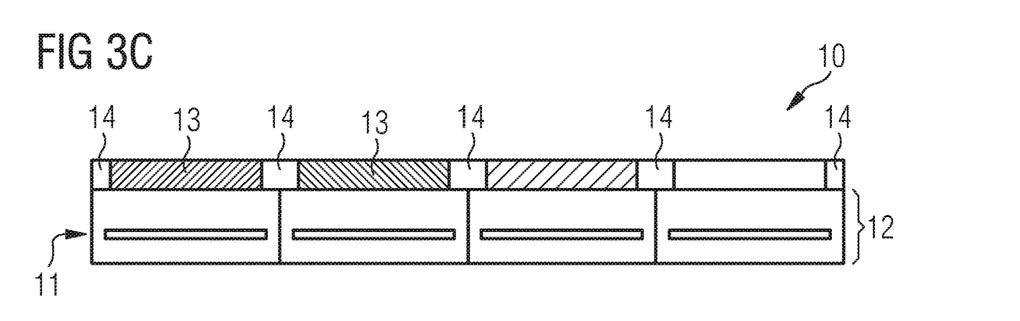

FIG. 3C shows the next step in the method with the aid of a sectional view through semiconductor body 12. In this method, the barrier 14, for example in the form of a two-dimensional lattice, is applied to the semiconductor body 12 between the conversion elements 13. Thus, a preformed barrier 14 can be used in this method.

Figure 3D:
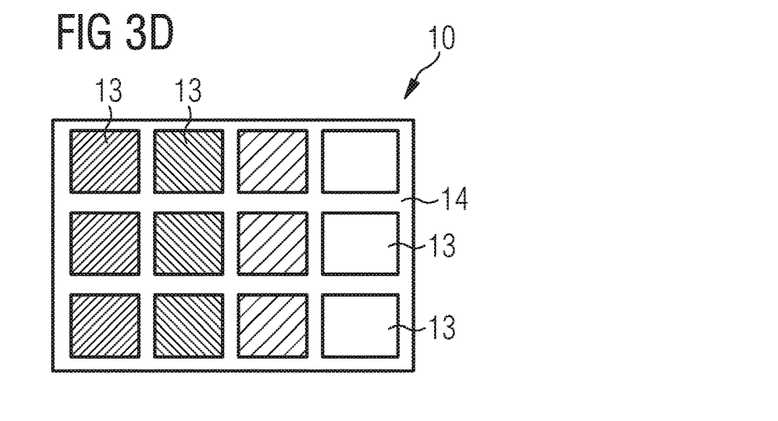

FIG. 3D shows a top view of the semiconductor body 12 as shown in FIG. 3C. The barrier 14 is disposed in lateral directions x between the conversion elements 13.

Figure 4A:
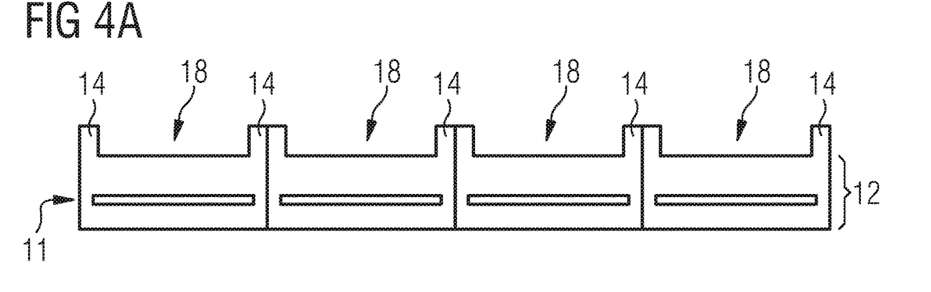

FIG. 4A shows a sectional view through semiconductor body 12 to illustrate another example of the method. Cavities 18 are etched into the semiconductor body 12. In this case, the boundaries of the cavities 18 form the barrier 14 and a reflective or absorbing material can be applied to the side surfaces of the boundaries which are perpendicular to the main plane of the semiconductor body 12.

Figure 4B:
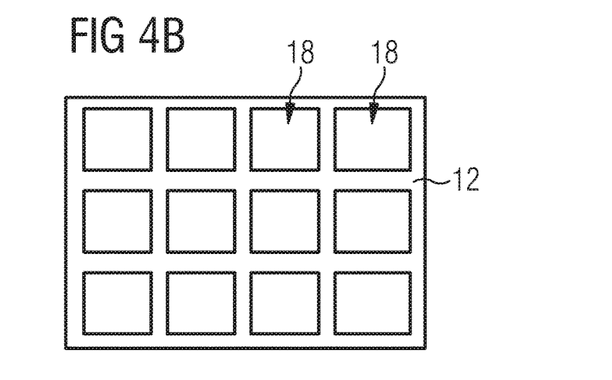

FIG. 4B shows a top view of semiconductor body 12 as shown in FIG. 4A. Cavities 18 are disposed at the nodes of a regular two-dimensional lattice.

Figure 4C:
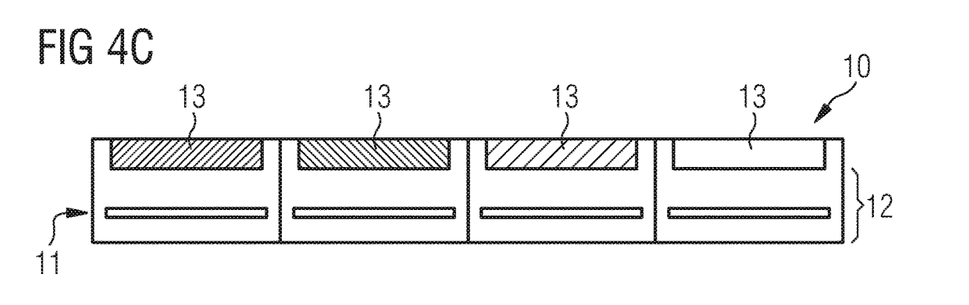

FIG. 4C shows the next step in the method with the aid of a sectional view through semiconductor body 12. The conversion elements 13 are incorporated into the cavities 18. Thus, the vertical distance between the conversion elements 13 and the active region 11 can be minimized. This allows the thickness of the optoelectronic semiconductor chip 10 to be reduced in the vertical direction z.

Figure 4D:
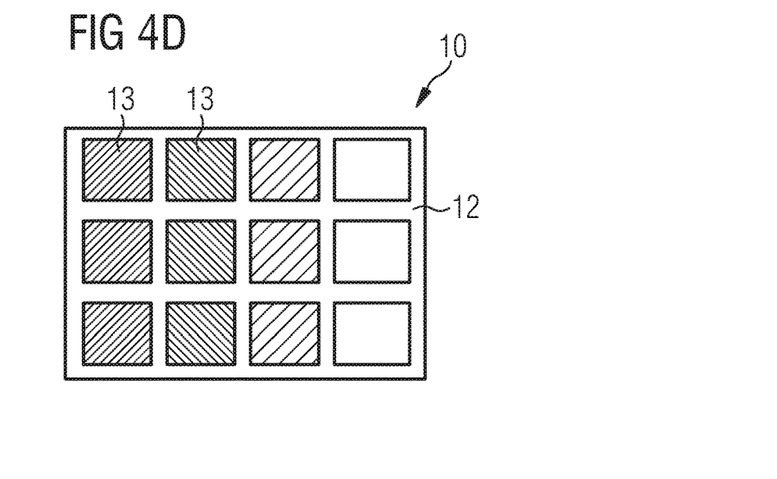

FIG. 4D shows a top view of semiconductor body 12 as shown in FIG. 4C. In the cavities 18 the conversion elements 13 are disposed at the nodes of a regular two-dimensional lattice. The conversion elements 13 can be different from each other.

Figure 5A:
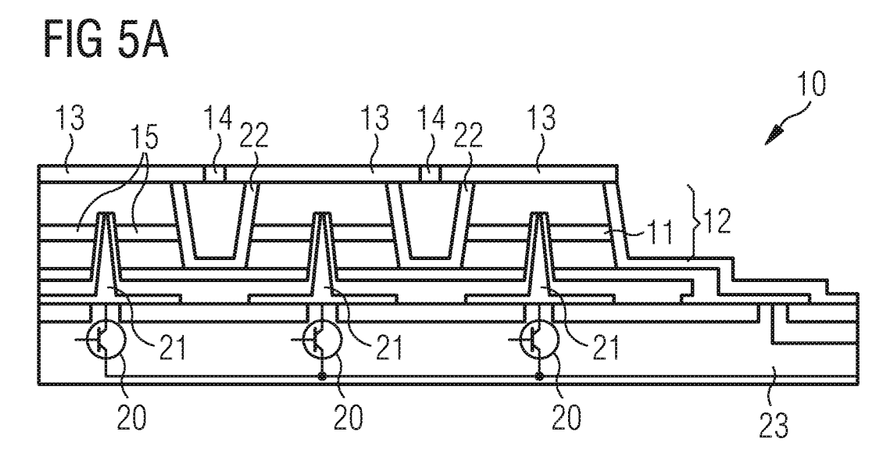
FIGS. 5A and 5B show schematic cross-sections through further exemplary embodiments of the optoelectronic semiconductor chip.

FIG. 5A shows a schematic cross-section of an exemplary embodiment of the optoelectronic semiconductor chip 10. The active region 11 is disposed in the semiconductor body 12. The semiconductor body 12 is disposed on a carrier 23. Thereby each of the emission regions 15 can be controlled separately via a separate switch 20. Each of the switches 20 is electrically conductively connected to a connection layer 21. The connection layers 21 are disposed in recesses in the semiconductor body 12. Isolation layers 22 are disposed between the emission regions 15. Each of the conversion elements 13 is disposed in a direction of emission of electromagnetic radiation emitted from one of the emission regions 15 during operation. The barrier 14 is disposed in lateral direction x between the conversion elements 13.

Figure 5B:
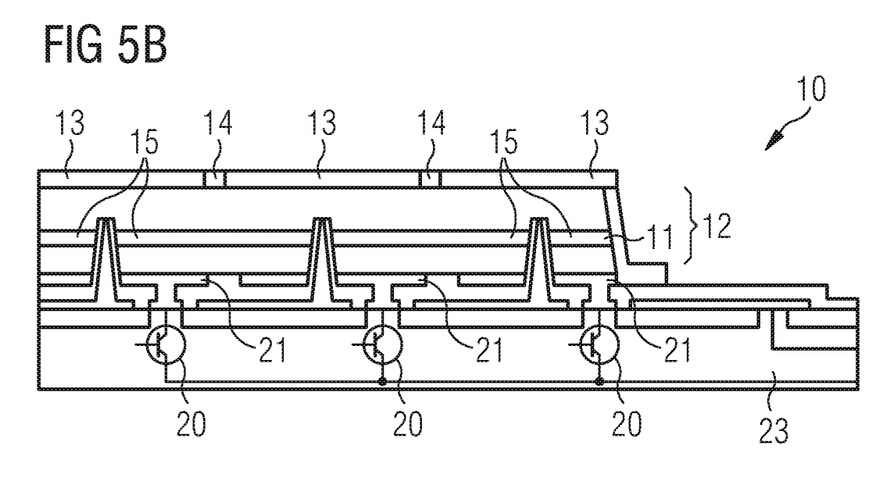

FIG. 5B shows a schematic cross-section of another exemplary embodiment of the optoelectronic semiconductor chip 10. The active region 11 extends through the entire semiconductor body 12. In comparison to the exemplary embodiment in FIG. 5A, there are no isolation layers 22 disposed between the emission regions 15. Each of the emission regions 15 can be controlled separately via its own separate switch 20. Each of the switches 20 is electrically conductively connected to a connection layer 21.

The invention is not limited by the description of the exemplary embodiments. Rather, the invention comprises any new feature as well as any combination of features, which in particular includes any combination of features in the claims, even if this feature or combination itself is not explicitly stated in the claims or the exemplary embodiments.

This patent application claims the priority of the German patent application DE 102017124307.0, the disclosure content of which is hereby incorporated by reference.

LIST OF REFERENCE SIGNS

10: optoelectronic semiconductor chip
11: active region
12: semiconductor body
13: conversion element
14: barrier
15: emission region
16: first conversion element
17: second conversion element
18: cavity
19: radiation exit side
20: switch
21: connection layer
22: isolation layer
23: carrier
x: lateral direction
z: vertical direction

The invention claimed is:
1. An optoelectronic semiconductor chip comprising:
an active region in a semiconductor body having a main plane of extension, the active region configured to emit electromagnetic radiation during operation of the optoelectronic semiconductor chip;
at least two conversion elements configured to convert the wavelength of the electromagnetic radiation emitted by the active region during operation; and
at least one barrier which is at least partially impermeable to the electromagnetic radiation emitted by the active region; wherein:
the semiconductor body comprises recesses having connection layers arranged therein;
wherein the recesses completely break through the active region;

the barrier is disposed in a lateral direction between the conversion elements; wherein the lateral direction is parallel to the main extension plane of the semiconductor body;
a reflective or absorbent material is arranged on a side surface of the barrier;
the barrier extends transverse to the lateral direction;
the active region comprises at least two emission regions which can be controlled separately from one another;
each of the at least two conversion elements is disposed in a direction of emission of electromagnetic radiation emitted from one of the at least two emission regions; and
the barrier comprises the same material as the semiconductor body;
wherein cavities are formed in the semiconductor body.

2. The optoelectronic semiconductor chip according to claim 1, wherein the extension of each of the at least two conversion elements in the vertical direction perpendicular to the main extension plane of the semiconductor body is at most 30% of the lateral extension of the respective conversion element.

3. The optoelectronic semiconductor chip according to claim 1, wherein the extension of each of the at least two conversion elements in the vertical direction perpendicular to the main extension plane of the semiconductor body is at most 2 µm.

4. The optoelectronic semiconductor chip according to claim 1, wherein each of the at least two conversion elements comprises a matrix material in which conversion particles are incorporated.

5. The optoelectronic semiconductor chip according to claim 4, wherein a lateral extent of the conversion particles is not more than 10% of the lateral extent of one of the conversion elements.

6. The optoelectronic semiconductor chip according to claim 4, wherein the conversion particles are quantum dots.

7. The optoelectronic semiconductor chip according to claim 1, wherein at least one first conversion element of the at least two conversion elements is arranged to convert the wavelength of the electromagnetic radiation emitted from the active region during operation to a different wavelength than at least one second conversion element of the at least two conversion elements.

8. The optoelectronic semiconductor chip according to claim 1, wherein the at least two conversion elements are disposed at nodes of a two-dimensional lattice.

9. The optoelectronic semiconductor chip according to claim 1, wherein the barrier completely surrounds each of the at least two conversion elements in lateral directions, said lateral directions being parallel to the main extension plane of the semiconductor body.

10. The optoelectronic semiconductor chip according to claim 1, wherein the at least two emission regions are monolithically formed with each other.

11. The optoelectronic semiconductor chip according to claim 1, wherein the reflective material arranged on the side surface of the barrier comprises a metal.

12. A method of manufacturing an optoelectronic semiconductor chip, wherein the method comprises:
providing a semiconductor body with a main plane of extension;
providing an active region in the semiconductor body, wherein the active region is configured to emit electromagnetic radiation during operation of the optoelectronic semiconductor chip;
applying at least two conversion elements to the semiconductor body, the at least two conversion elements configured to convert the wavelength of the electromagnetic radiation emitted by the active region during operation; and
forming a barrier at least partially impermeable to the electromagnetic radiation emitted by the active region; wherein:
the barrier is disposed in a lateral direction between the at least two conversion elements, the lateral direction being parallel to the main extension plane of the semiconductor body;
the barrier extends transverse to the lateral direction;
a reflective or absorbent material is arranged on a side surface of the barrier;
the active region has at least two emission regions configured to be controlled separately from one another, each of the at least two conversion elements is disposed in a direction of emission of electromagnetic radiation emitted from one of the at least two emission regions;
the barrier is formed before the application of the at least two conversion elements; and
the barrier is formed by ablating the semiconductor body.

13. The method according to claim 12, wherein the barrier forms at least two cavities; wherein each cavity of the at least two cavities comprises a conversion element incorporated thereinto.

14. The method according to claim 12, wherein the extension of each of the at least two conversion elements in the vertical direction perpendicular to the main extension plane of the semiconductor body is at most 2 µm.

15. The method according to claim 12, wherein each of the at least two conversion elements comprises a matrix material in which conversion particles are incorporated.

16. The method according to claim 15, wherein a lateral extent of the conversion particles is not more than 10% of the lateral extent of one of the conversion elements.

17. The method according to claim 12, wherein the conversion particles are quantum dots.

18. The method according to claim 12, wherein at least one first conversion element of the at least two conversion elements is arranged to convert the wavelength of the electromagnetic radiation emitted from the active region during operation to a different wavelength than at least one second conversion element of the at least two conversion elements.

19. The method according to claim 12, wherein the barrier completely surrounds each of the at least two conversion elements in lateral directions, said lateral directions being parallel to the main extension plane of the semiconductor body.

20. The method according to claim 12, wherein the at least two emission regions are monolithically formed with each other.

* * * * *